United States Patent
Kosiec

[11] Patent Number: 6,101,521
[45] Date of Patent: Aug. 8, 2000

[54] DATA PROCESSING METHOD AND APPARATUS OPERABLE ON AN IRRATIONAL MATHEMATICAL VALUE

[75] Inventor: Jeannie Han Kosiec, Schaumburg, Ill.

[73] Assignee: Motorola, Inc., Schaumburg, Ill.

[21] Appl. No.: 09/047,774

[22] Filed: Mar. 25, 1998

[51] Int. Cl.[7] ...................................................... G06F 7/58
[52] U.S. Cl. ........................ 708/550; 708/204; 708/605
[58] Field of Search ................................... 708/550, 605, 708/517, 496, 500, 490, 204

[56] References Cited

U.S. PATENT DOCUMENTS

| | | | |
|---|---|---|---|
| 5,184,317 | 2/1993 | Pickett | 708/517 |
| 5,570,310 | 10/1996 | Smith | 708/517 |
| 5,608,663 | 3/1997 | Smith | 708/517 |
| 5,619,711 | 4/1997 | Anderson | 708/496 |
| 5,948,048 | 9/1999 | Kim | 708/204 |

OTHER PUBLICATIONS

Schreier et al., "Decimation for Bandpass Sigma–Delta Analog–to–Digital Conversion", *IEEE*, 1990, pp. 1801–1804.

*Primary Examiner*—David H. Malzahn
*Attorney, Agent, or Firm*—John G. Rauch; Brian M. Mancini

[57] ABSTRACT

A data processing apparatus (200) which improves the accuracy of resultant data. The data processing apparatus includes an input (220, 222) configured to receive input data. The input data includes data corresponding to an input coefficient to be multiplied by the square root of two ($\sqrt{2}$) and input addend. The data processing apparatus further includes a first memory (202) for storing a coefficient of the square root of two, a second memory (204) for storing an addend, a summer (206, 208) which independently sums the input coefficient and the coefficient to produce a combined coefficient and sums the input addend and the addend to produce an addend sum, a multiplier (210) which multiplies the combined coefficient and an approximation of the square root of two to produce an intermediate result, and a summer (214) which sums the intermediate result and the addend sum to produce the resultant data.

20 Claims, 2 Drawing Sheets

DATA PROCESSING METHOD AND APPARATUS OPERABLE ON AN IRRATIONAL MATHEMATICAL VALUE

FIELD OF THE INVENTION

The present invention generally relates to a data processing method. More particularly, the present invention relates to a method of storing and operating on data corresponding to irrational numbers such as the square root of two ($\sqrt{2}$).

BACKGROUND OF THE INVENTION

Often, data processing applications require storage and manipulation of irrational numbers, which are defined to be numbers which can not be expressed as a ratio of two integers. Examples include pi ($\pi$), the base of the natural logarithm l, and the square root of most integers, such as the square root of 2 ($\sqrt{2}$). These numbers are approximated as 3.14159 . . . , 2.71828 . . . , and 1.414 . . . , respectively. Irrational numbers require an infinite number of digits for precise representation.

In data processing applications, irrational numbers such as these must be approximated when storing or operating. In a data processing system, all numerical values are stored as multi-bit binary data. The number of bits by which a number can be stored is generally fixed at a number such as 8 bits, 32 bits or 64 bits. Integer values can be stored directly, while non-integer real numbers such as 1.414 must be stored as an integer part and a fractional part. A real number can be stored precisely if the value of the real number is small enough or if the fractional portion, the digits to the right of the decimal point, is small enough to be represented by the number of bits available. Irrational numbers, which have an infinite number of digits if represented as a real number, can never be stored precisely but must be truncated to a storable size.

Algebraic manipulations and storage of irrational numbers have heretofore been accomplished by approximating an irrational number with the maximum number of bits available, and storing and manipulating the approximation. However, this necessarily results in truncation error, and the error is compounded with each operation subsequent to the approximation in the form of rounding error. Each addition, multiplication or other mathematical or logical operation on the data results in rounding error. After many such operations, the error may become unacceptable.

Accordingly, there is a need in the art for an improved method of storing and manipulating data in a data processing system which maximizes the accuracy of representation of irrational numbers such as the square root of 2 ($\sqrt{2}$).

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
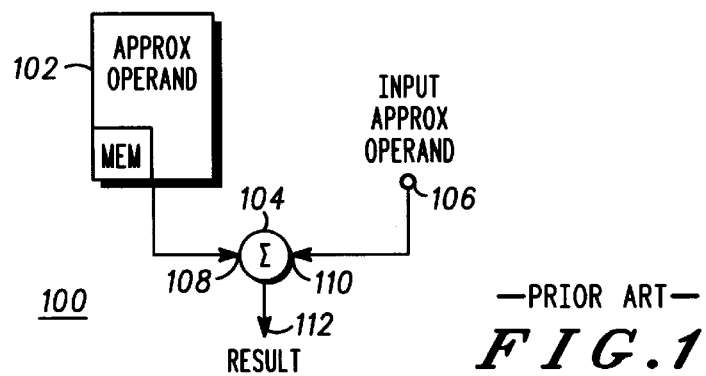
FIG. 1 is a block diagram of a prior art data processing apparatus.

Referring now to FIG. 1, it shows a block diagram of a prior art data processing apparatus 100. The data processing apparatus 100 includes a memory 102 and a summer 104. The memory 102 stores one or more operands and is of a fixed size. For example, the memory may be 64 words long by 8 bits wide, or 256K words by 32 bits. Alternatively, the memory 102 may be a register which stores a single word of fixed width such as 8, 16 or any number of bits.

Operands stored in the memory 102 are of finite size. Thus, if the memory is 8 bits wide, the maximum operand value (if the operand is an integer) is $2^8$ or 256. For storing real numbers, some times referred to as floating point values, an integer portion and a fractional portion are stored. The integer portion represents the value to the left of the decimal point of the real number and the fractional portion represents the value to the right of the decimal point.

Since memory words are of fixed width, storage of integer and fractional values often requires rounding or approximation. If the integer or fractional value requires more bits for representation than are available in a memory word width, the excess bits are truncated and an approximation is stored. Truncation may occur when a number is converted to binary data for storage or as part of a mathematical or logical operation.

Truncation occurs whenever an irrational number is stored or is part of an operation. Irrational numbers have an infinite number of digits when represented as real numbers. Accordingly, in a finite-sized memory such as memory 102, irrational numbers must be approximated, leading to truncation errors.

Summer 104 is a conventional summer. Summer 104 mathematically sums the value at first input 108, received from the memory 102, and the value at second input 110, received from input 106. The summer 104 produces the sum as a result at an output 112. The summer 104 typically includes internal registers for storing and combining the operands from the memory 102 and the input 106. These internal registers are of fixed width.

If the sum produced by the summer 104 is a number which cannot be stored in the number of bits corresponding to the fixed width of the registers of the summer error, the sum must be truncated, producing rounding error. If the operand from the memory 102 was truncated for storage in the memory and the sum produced using this operand is truncated by rounding, the truncation and rounding errors compound the inaccuracy of the result. If the operand from the memory 102 is an irrational value, this error compounding always results because the irrational number can never be stored precisely in a finite-width memory.

Figure 2:
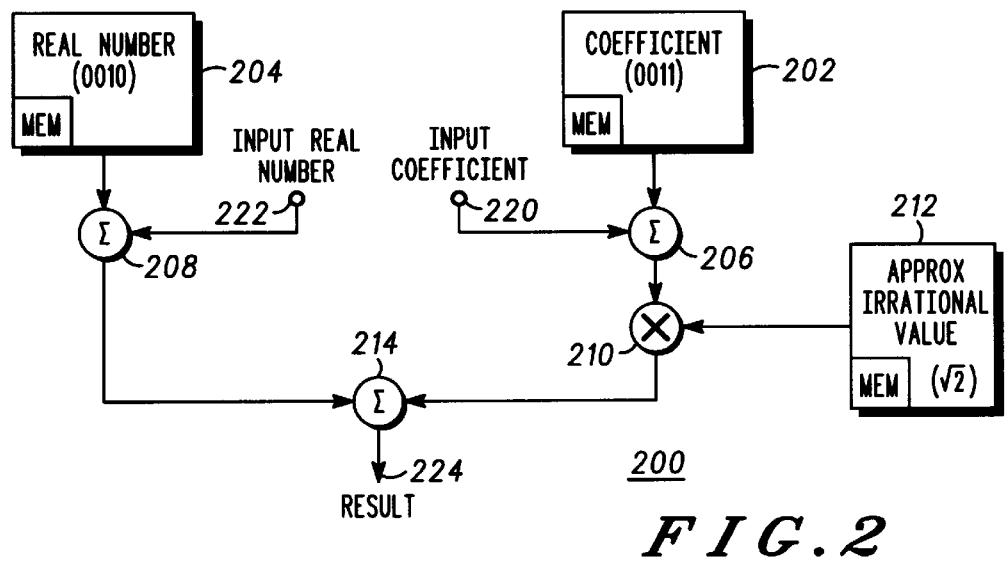
FIG. 2 is a block diagram of an apparatus which may operate in accordance with the present invention.

FIG. 2 shows a block diagram of a data processing apparatus 200 in accordance with the present invention. The data processing apparatus 200 includes a coefficient memory 202, a rational number memory 204, a first summer 206, a second summer 208, a multiplier 210, a third memory 212 and a summer 214. The embodiment of FIG. 2 is illustrative only. The data processing apparatus 200 may be constituted in any of a variety of operationally equivalent structures, all within the purview of the ordinary skilled artisan.

In accordance with the present invention, data is stored and operated on by separating a digital word into two separate portions. One portion represents coefficients for a number such as an irrational number. The other portion represents everything else, including real and integer values to be combined with the irrational number. This referred to as the rational portion or rational number. Then, continuing with the example of an irrational number, instead of converting the irrational number to a decimal or binary number, the irrational number is kept as a unit when going through summation, subtraction, multiplication and division with other numbers until the end of the calculation. Just before the final result is produced, the coefficients of the irrational number are multiplied by a decimal or binary representation of the irrational number and combined with the rational portion to form a single decimal or binary result.

This method and apparatus according to the present invention improves the precision of calculations and the accuracy of the final result. If the number of bits in the irrational number portion covers the coefficient range of the irrational number, the precision of representing an irrational number using this new data format is infinite until the exact number of bits is assigned to represent the irrational number when the coefficient is converted and multiplied by the irrational number at the end of the procedure. This results in higher precision with shorter word length.

It should be noted that the invention is not limited to use with irrational numbers. Instead, any number, referred to herein as a reference number, that is too large for convenient representation may be processed by handling coefficients separately and combining the reference number and the coefficients after storage and processing. For example, the method according to the invention may be used if the number requires a large or not readily available word size for storage, while the coefficients may be stored in conventional memory elements. An example is a reference number that requires seventeen bits to store precisely, while all coefficients can be precisely stored in sixteen bits or less. Sixteen bit wide memories and registers are conventionally available, but seventeen bit memories may require a more expensive custom design. In such a data processing apparatus, most of the data handling structure may be built using sixteen bit wide components, with the larger seventeen bit components saved for producing and storing the reference number and the result. The examples to follow will focus on operations involving irrational numbers in general and the square root of two ($\sqrt{2}$).

The structure and operation of the exemplary embodiment of FIG. 2 will now be described. The data processing apparatus 200 operates on data. At least some of the data correspond to an irrational mathematical value. The irrational mathematical value is represented in the data structure (also referred to herein as a data format) according to the present invention. The first portion of the data format, including the irrational number, is processed in the coefficient memory 202, the first summer 206 and the multiplier 210. The second portion of the data format is processed in the rational number memory 204 and the summer 208.

The coefficient memory 202 stores coefficients of the irrational number. The coefficient memory 202 may be any suitable size, including one word or multiple words. The coefficient memory 202 thus forms a memory means for storing a first group of data elements having a predetermined relation to an irrational number. In this example, the predetermined relation is that of coefficients of the irrational number. However, in alternative embodiment, the predetermined relation could be exponents of the irrational number or divisors or any other relation which would cause the resulting number to be inconvenient or more expensive to process. Also, in the present example, the coefficients are stored as binary bits. However, other types of data elements or representations of data may be stored also.

The summer 206 sums the coefficient in the coefficient memory 202 and an input coefficient received at an input 220. The result of the summer 206 is provided to the multiplier 210. However, in alternative embodiments, the result may be provided to storage for subsequent processing or even stored in coefficient memory 202. Such possibilities are not shown in FIG. 2 s as to not unduly complicate the drawing figure.

The multiplier 210 combines the result from the summer 206 with a value stored in the third memory 212. The value stored in the third memory 212 is a multiple-bit approximation of a number. The value stored is a representation of the irrational number (or reference number) which can not be represented conveniently or precisely in a fixed-width memory. Thus, the third memory 212 stores an approximation of the irrational number. Preferably, the irrational number is approximated to as many bits as possible to maximize the precision of the data processing apparatus 200. The multiplier 210 multiplies the coefficient value, from the summer 206, and the irrational number from the third memory 212 and produces a result. The result is necessarily an approximation having finite precision, because of the approximation of the value of the irrational number stored in the third memory 212. In applications where the relation between the data elements stored in the coefficient memory 202 and the third memory is other than coefficient to multiplicand, the multiplier 210 will be replaced by another suitable operational block for combining the two values to produce a real number result.

The rational number memory 204 stores a rational or real number to be combined with the irrational portion of the data format. The rational number memory 204 thus forms a second memory means for storing a second group of data elements having a predetermined relation to a real number. The rational number memory 204 stores an exact representation of an addend associated with a product of the coefficient, stored in the coefficient memory 202, and the number stored in the third memory 212. In the illustrated embodiment, the data elements form a binary representation of the real number, but other relationships may be used. The first group of data elements (e.g., the coefficient in coefficient memory 202) and the second group of data elements in the rational number memory 204 in combination correspond to an irrational mathematical value.

The summer 208 combines the rational number from the rational number memory 204 with an input real number received at an input 222 and produces a result. The summer 214 combines the result from the summer 208 and the result from the multiplier 210 and produces a final result at an output 224.

The summer 206, the summer 208, the multiplier 210 and the summer 214 thus form operating means for combining the first group of data elements from the coefficient memory 202 and the second group of data elements from the real number memory. It is to be understood that in other embodiments, other combinations of mathematical and logical and storage elements will be used for operating on data stored in the data format according to the present invention. For example, discrete operation blocks such as summers and multipliers may be replaced with an arithmetic logic unit (ALU) or other data processor which provides sequential or combinatorial processing of data. Similarly, the memory elements of the illustrated embodiment may be formed from any suitable storage medium, such as random access memory (RAM), also known as read-write memory (RWM), read only memory (ROM), or magnetic storage media. The values shown as being stored in memory may be inputs to the data processing apparatus 200.

In one embodiment, the data processing apparatus 200 improves the accuracy of resultant data, particularly when making calculations involving the square root of two ($\sqrt{2}$). The input 220 and the input 222 together form an input configured to receive input data, the input data including data corresponding to an input coefficient (at the input 220) to be multiplied by the square root of two ($\sqrt{2}$) and an input addend (at the input 222). The data processing apparatus 200 further includes a first memory portion, coefficient memory 202, for storing a coefficient of the square root of two and a second memory portion, rational number memory 204, for storing an addend. The summer 206 and the summer 208 form a summer which independently sums the input coefficient to produce a combined coefficient and sums the input addend to produce an addend sum. In an alternative embodiment, the summing operation is performed by a single summer which is time-shared between summing the square root of two portion and the addend portion. The single summer may also be time shared to perform the function of the summer 214. The multiplier 210 forms a multiplier which multiplies the combined coefficient and an approximation of the square root of two, stored in the third memory, 212, to produce an intermediate result. The summer 214 forms a summer which sums the intermediate result and the addend sum to produce the resultant data.

The nature of the square root of two, when represented in the data format according to the present invention, allows improved precision of mathematical calculation. When a number in this data format is to be divided or multiplied by the square root of two ($\sqrt{2}$), the required operation is simply to switch the data stored in the square root of two portion with the data stored in the non-square root of two portion and subsequently shift the data in the square root of two portion in the appropriate direction. Multiplication by the square root of two corresponds to an arithmetic shift left of the data in the square root of two portion. Division by the square root of two corresponds to an arithmetic shift right of the data in the square root of two portion.

Mathematical operations using the data format according to the present invention are illustrated in the table below. Two's complement number representation is used in this table.

| Ex | Input Number | Operation | Data Format | Result |
|----|--------------|-----------|-------------|--------|
| 1 | $2 + 3\sqrt{2}$ |  | 0010 0011 |  |
| 2 | $2 + 3\sqrt{2}$ | +1 = | 0011 0011 | $3 \times 3\sqrt{2}$ |
| 3 | $2 + 3\sqrt{2}$ | −3 = | 1111 0011 | $-1 + 3\sqrt{2}$ |
| 4 | $2 + 3\sqrt{2}$ | ×2 = | 0100 0110 | $4 + 6\sqrt{2}$ |
| 5 | $2 + 3\sqrt{2}$ | ÷2 = | 0001 0001 | $1 + 1\sqrt{2}$ |
| 6 | $2 + 3\sqrt{2}$ | $+\sqrt{2}$ = | 0010 0100 | $2 + 4\sqrt{2}$ |
| 7 | $2 + 3\sqrt{2}$ | $-4\sqrt{2}$ = | 0010 1111 | $2 - 1\sqrt{2}$ |
| 8 | $2 + 3\sqrt{2}$ | $\times \sqrt{2}$ = | 0110 0010 | $6 + 2\sqrt{2}$ |
| 9 | $2 + 3\sqrt{2}$ | $\div \sqrt{2}$ = | 0011 0001 | $3 + 1\sqrt{2}$ |

In Example 1 shown in the first row of the table, the input value is the irrational number $2+3\sqrt{2}$. In the data format according to the present invention, this number is represented in one byte as 0010 0011. The first nibble, 0010, is the binary representation of the real value 2. The second nibble, 0011, is the binary representation of the coefficient of the square root of two, in this case 3. In this example, a total of eight bits is used to represent the number $2+3\sqrt{2}=6.242640687 \ldots$ An equivalent eight bit binary representation of the same number using four bits for the fractional portion is 01100011, which is 6.1875. The truncation error is approximately 0.9% using the traditional binary data format. The truncation error is 0% using the new data format according to the present invention. Further, a multiply or divide operation using the traditional binary data format would require a complete multiplier or divider, which is a substantially large and complicated circuit, requires a large amount of real estate on an integrated circuit and has substantial power drain. Multiply and divide operations involving the square root of two, or any reference number, are greatly simplified when using the method and apparatus of the present invention, as will be described below.

In Example 2, shown in the second row of the table, the real number 1 is added to the input value. This results in the irrational number $3+3\sqrt{2}$, represented in the data format according to the present invention as 0011 0011. Similarly, in Example 3, the real value 3 is subtracted from the input irrational number to yield $-1+3\sqrt{2}$, represented as 1111 0011.

In Example 4, the input number is multiplied by 2. Accordingly, both the non-square root of two portion (0010) and the square root of two portion (0011) are multiplied by two, yielding 0100 0110. In like manner, in Example 5, the input irrational number is divided by two, requiring that both the non-square root of two portion (0010) and the square root of two portion (0011) be divided by two, yielding 0001 0001. This binary value corresponds to $1+1\sqrt{2}$, rather than $1+(1.5)\sqrt{2}$, which is the correct value. The error is a truncation error because there are insufficient bits to accurately represent the coefficient 1.5.

In Example 6, the square root of two is added to the input number. In the data format in accordance with the present invention, this addition is accomplished by incrementing the coefficient in the square root of two portion by one. Similarly, in Example 7, $4\sqrt{2}$ is subtracted from the input number, yielding the result 0010 1111, corresponding to $2-1\sqrt{2}$.

In Example 8, the input value is multiplied by the square root of two. This is accomplished by switching the content of the square root of two portion with the non-square root of two portion and shifting the new non-square root of two bits to the left. In the first step, the 0010 non-square root of two bits are placed in the square root of two portion and the 0011 square root of two bits are placed in the non-square root of two portion. In the second step, the 0011 bits newly placed in the non-square root of two portion are shifted to the left, forming 0110.

In Example 9, the input value is divided by the square root of two. Similar to the multiplication of Example 3, this is accomplished by switching the content of the square root of two portion with the non-square root of two portion and shifting the new non-square root of two bits to the right. In the first step, the 0010 non-square root of two bits are placed in the square root of two portion and the 0011 square root of two bits are placed in the non-square root of two portion. In the second step, the 0011 bits newly placed in the non-square root of two portion are shifted to the right, forming 0011.

Figure 3:
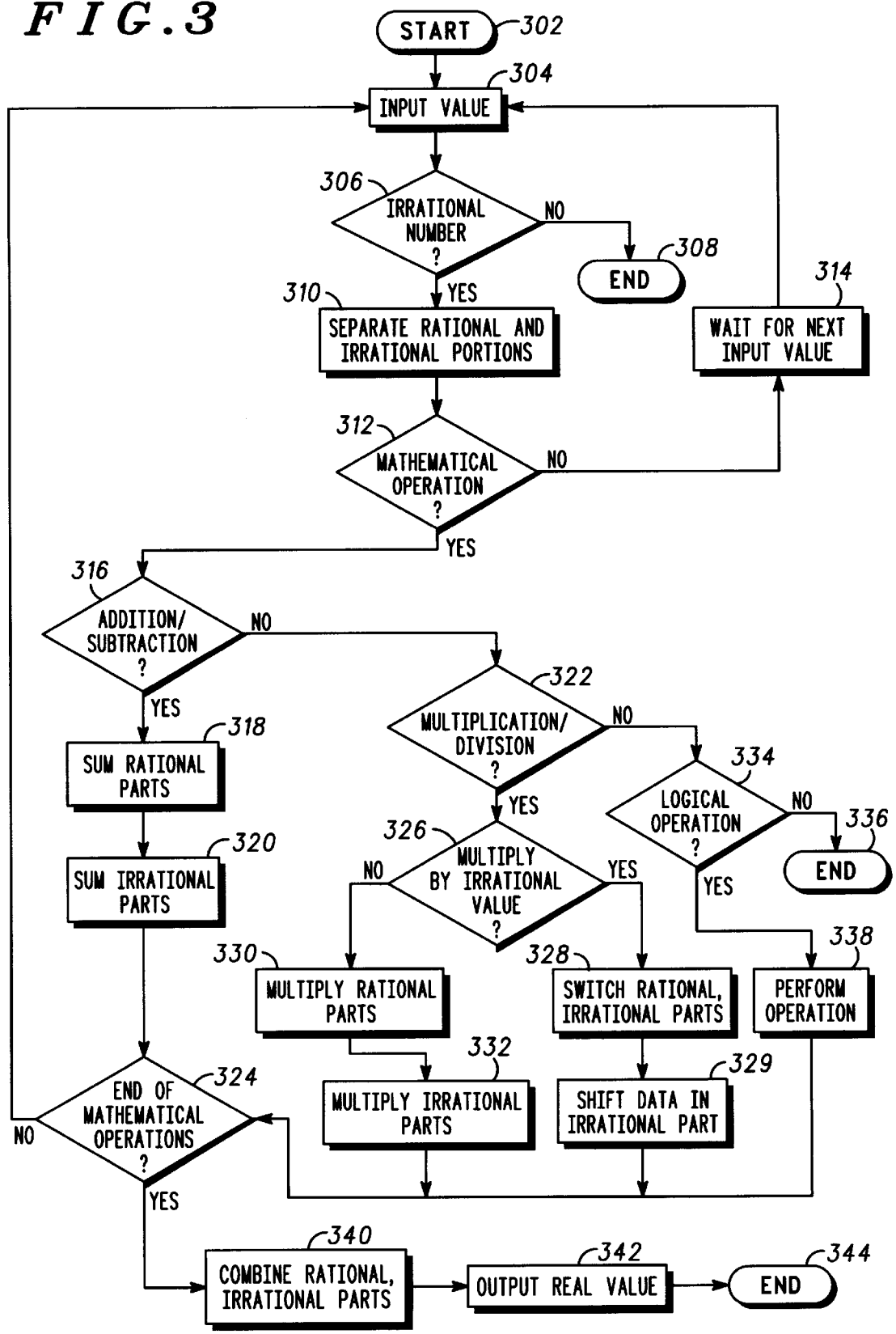
FIG. 3 is a flow diagram illustrating a method according to the present invention.

FIG. 3 is a flow diagram illustrating a method of operating on data corresponding to an irrational mathematical value. The method is illustrated using the irrational number square root of two ($2\sqrt{2}$). However, any irrational number may be used. In fact, the method may be used in conjunction with any reference number which may not be easily represented or manipulated in binary format. The method is also an example of a method of reducing rounding error and truncation error in a data processing system.

The method begins at step 302. At step 304, an input value is received. The method of FIG. 3 is particularly well suited to operation on input values which are irrational mathematical values, such as a real part combined with an irrational part. At step 306, it is determined if the input value is an irrational number. If not, the method ends at step 308. If the input value is an irrational number, at step 310, the irrational number is separated into rational and irrational portions. By rational portion is meant a value which can be precisely expressed given the number of binary bits used to store the value. For example, if a four bit nibble is used to store the value of the real portion, positive integers up to $2^4=16$ precisely expressed. If signed values or real values having integer and fractional portions are part of the input value, a different number of bits may be required to precisely represent these values. The irrational portion contains a number having a predetermined relation to an irrational number or other reference number. For example, the irrational portion may store a coefficient of an irrational number such as the square root of two ($2\sqrt{2}$).

At step 312, it is determined if a mathematical operation has been specified. If not, at step 314 the method looks for the next input value which will form a second operand and control returns to step 304. The second operand could also be retrieved from memory, rather than received as an input value.

At step 316, the method determines if an addition or subtraction operation has been specified. If so, at step 318, the rational parts of the two operands are combined and at step 320 the irrational parts of the two operands are combined. Control proceeds to step 324.

If no addition or subtraction operation was specified, at step 322 it is determined if a multiplication or division operation has been specified. If so, at step 326, it is determined if the operation involves multiplication or division by the irrational reference value as the second operand. If not, control proceeds to step 330. If so, at step 328, the rational and irrational parts of the first operand are first switched. Then at step 329, data in the irrational part is shifted appropriately right for division and left for multiplication. If the multiplication/division operation did not involve the reference value, at step 330, the rational parts of the two operands are multiplied and at step 332, the irrational parts of the two operands are multiplied. Control then proceeds to step 324.

If neither addition/subtraction nor multiplication/division are specified, the method determines at step 334 if a logical operation is specified. Examples of logical operations are logical and arithmetic shifts, AND, OR, NAND, NOR and negation. If no logical operation is specified, the method ends at step 336. Otherwise, at step 338, the logical operation is performed and control proceeds to step 324.

Step 324 determines if mathematical operations involving the input operands have ended so that a final result may determined and provided as an output value. If not, and if it is desired to retain the data format of the present invention, control returns to step 304 to await a new input value. Otherwise, the method calculates the output value.

Up to this point in the method, the rational and irrational portions of the operands and results have been stored with 0% truncation or rounding error. To calculate the output value requires estimating the irrational number or other reference number. The estimate is calculated or retrieved from memory and multiplied by the irrational portion of the result at step 340. This approximation of an irrational number is then summed with the rational portion to produce the output value. The output value, a real number, is produced at step 342 and the method ends at step 344.

Figure 4:
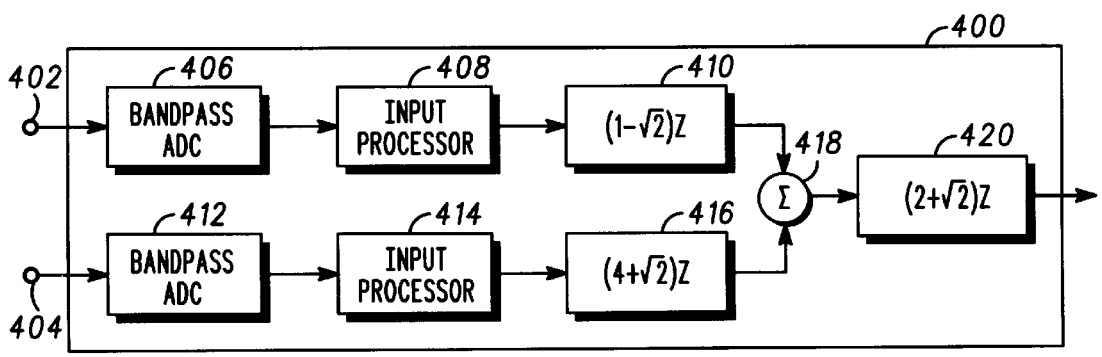
FIG. 4 is a block diagram of a digital signal processor operable in accordance with the present invention.

FIG. 4 is a block diagram of a digital signal processor 400 which may employ the method according to the present invention. The digital signal processor 400 has an input 402 for receiving a first value and an input 404 for receiving a second value. The digital signal processor 400 further includes a first bandpass analog to digital converter (ADC) 406 and a second bandpass ADC 412. The digital signal processor 400 still further includes an input processor 408 and an input processor 414. The digital signal processor 400 still further includes a first filter 410, a second filter 416, a combiner 418 and a second filter 420.

The first bandpass ADC 406 and the second bandpass ADC 412 convert analog signals received at the input 402 and the input 404, respectively, to digital data representing the input signals. The input 402 and the input 404, together with the first bandpass ADC 406 and the second bandpass ADC 412, form an input configured to produce input data related to an input signal. For example, the input data may be binary representations of the input signal. Moreover, in the illustrated embodiment, the input data include data corresponding to an input coefficient to be multiplied by the square root of two ($2\sqrt{2}$) or some other irrational number or reference number. The input processor 408 and the input processor 414 digitally process the first value and the second value, respectively.

The first filter 410 filters the input data received by the first bandpass ADC 408 according to the filter equation shown in FIG. 4. Similarly, the second filter 416 filters the input data received by the second bandpass ADC 412 according to the illustrated filter equation. The outputs of the two filters are combined in the combiner 418 and the combined outputs are filtered in the third filter 420 according to the illustrated filter equation. The result of this filtering is provided as the output from the digital signal processor 400.

The first filter 410, the second filter 416 and the third filter 420 all involve algebraic manipulation of the irrational number square root of two ($2\sqrt{2}$). In accordance with the present invention, the digital signal processor 400 includes a first memory portion for storing a coefficient of the square root of two and a second memory portion for storing an addend. The first and second memory portions may be shared among the three filters and among the operational circuitry of the digital signal processor 400. The digital signal processor 400 further includes a summer which independently sums the input coefficient and the coefficient to produce a combined coefficient and sums the input addend and the addend to produce an addend sum, a multiplier which multiplies the combined coefficient and an approximation of the square root of two to produce an intermediate result, and a summer which sums the intermediate result and the addend sum to produce output data. Lastly, the digital signal processor 400 includes an output configured to provide an output signal corresponding to the output data.

As can be seen from the foregoing, the present invention provides a method and apparatus for storing and algebraically manipulating irrational mathematical values. A rational value and a coefficient of an irrational value are stored as fixed-size multiple bit values. Algebraic operations may be readily performed with exact precision by operating on only the precisely represented irrational value and coefficient. Only when a final value including an approximation of the irrational number is required are the coefficient and rational portion combined mathematically with the irrational number. In this manner, truncation and rounding errors are reduced. Algebraic operations involving the irrational number itself may be implemented using only summers and shifters eliminating the need for large, high-current multiplier and divider circuits.

While a particular embodiment of the present invention has been shown and described, modifications may be made. It is therefore intended in the appended claims to cover all such changes and modifications which fall within the true spirit and scope of the invention.

What is claimed is:

1. A method for operating on data containing an irrational mathematical value, the method comprising the steps of:

storing in a first memory portion a first group of data elements having a predetermined relation to an irrational number;

storing in a second memory portion a second group of data elements having a predetermined relation to a real number, the first group of data elements and the second group of data elements in combination representing with exact precision the irrational mathematical value;

multiplying the first group of data elements and a representation of the irrational number to produce an intermediate result; and summing the intermediate result and the second group of data elements to produce a result, the result approximating the irrational mathematical value having minimal error due to truncation and rounding.

2. The method of claim 1 further comprising the step of jointly manipulating arithmetically the first group of data elements and the second group of data elements.

3. The method of claim 1 wherein the method further comprises storing as the first group of data elements a multiple bit value corresponding to a coefficient to be multiplied by the irrational number.

4. The method of claim 3 wherein the method further comprises storing as the second group of data elements a multiple bit value corresponding to the real number.

5. The method of claim 4, wherein after the storing steps further comprising the steps of:

inputting input data elements having at least one of a rational portion and a representation of an irrational portion;

arithmetically combining the input data elements and the irrational mathematical value to produce a combined irrational mathematical value having a representation of a combined irrational number and combined first and second data elements; and replacing the representation of the irrational number and the first and second data elements of the irrational mathematical value with the representation of the combined irrational number and combined first and second data elements of the combined irrational mathematical value.

6. A data processing apparatus which operates on data containing an irrational mathematical value, the apparatus comprising:

first memory means for storing a first group of data elements having a predetermined relation to an irrational number;

second memory means for storing a second group of data elements having a predetermined relation to a real number, the first group of data elements and the second group of data elements in combination corresponding to the irrational mathematical value;

a multiplier for multiplying the first group of data elements and a representation of the irrational number to produce an intermediate result; and a summer for summing the intermediate result and the second group of data elements to produce a result, the result approximating the irrational mathematical value having minimal error due to truncation and rounding.

7. A data processing apparatus as recited in claim 6 further comprising an arithmetical operator unit that combines input data elements having at least one of a rational portion and a representation of an irrational portion and the irrational mathematical value to produce a combined irrational mathematical value having a representation of a combined irrational number and combined first and second data elements, the arithmetical operator unit replaces the representation of the irrational number and the first and second data elements of the irrational mathematical value with the representation of the combined irrational number and combined first and second data elements of the combined irrational mathematical value.

8. A data processing apparatus as recited in claim 7 wherein the at least one of the arithmetical operator unit, multiplier and summer comprise an arithmetic logic unit.

9. A method for operating on irrational mathematical values, the method comprising the steps of:

storing in a first memory portion a first group of data elements representing a coefficient of an irrational mathematical value;

storing in a second memory portion a second group of data elements representing a real number;

combining the first group of data elements with input data elements representing another coefficient of the irrational mathematical value to produce a combined coefficient;

multiplying the combined coefficient with an approximation of the irrational mathematical value to produce an intermediate result; and summing the intermediate result and the second group of data elements to produce a result having minimal error due to truncation and rounding.

10. The method of claim 9 wherein when the combining step includes multiplying the first group of data elements with the input data elements, the combining step includes the steps of:

switching contents of the first memory portion and contents of the second memory portion; and shifting the contents of the second memory portion one bit left.

11. The method of claim 9 wherein when the combining step includes dividing the first group of data elements by the input data elements, the combining step includes the steps of:

switching contents of the first memory portion and contents of the second memory portion; and shifting the contents of the second memory portion one bit right.

12. A data processing apparatus which improves the accuracy of resultant data in operations with irrational mathematical values, the data processing apparatus comprising:

an input of the apparatus configured to receive input data, the input data including data corresponding to an input coefficient to be multiplied by square root of two ($\sqrt{2}$) and an input addend;

a first memory for storing a coefficient of the square root of two;

a second memory for storing an addend;

a summer which independently sums the input coefficient and the coefficient to produce a combined coefficient and sums the input addend and the addend to produce an addend sum;

a multiplier which multiplies the combined coefficient and an approximation of the square root of two to produce an intermediate result; and a summer which sums the intermediate result and the addend sum to produce the resultant data having minimal error due to truncation and rounding.

13. The data processing apparatus of claim 12 further comprising a third memory for storing the approximation of the square root of two.

14. A method for reducing rounding error and truncation error of irrational mathematical values in a data processing system, the method comprising the steps of:

storing a multiple-bit approximation of an irrational number;

storing an exact representation of a coefficient associated with the irrational number;

storing an exact representation of an addend associated with a product of the coefficient and the irrational number;

multiplying the coefficient and the irrational number to produce an intermediate result; and summing the intermediate result and the addend to provide a result.

15. The method of claim 14 wherein the number is square root of two ($\sqrt{2}$).

16. A method for digitally filtering a signal representing an irrational mathematical value, the method comprising the steps of:

receiving an input signal;

forming a digital representation of the input signal;

mathematically operating on the digital representation by:
storing a multiple-bit approximation of an irrational number;

storing in a first memory portion an exact representation of a coefficient associated with the irrational number;

storing in a second memory portion an exact representation of an addend associated with a product of the coefficient and the irrational number;

combining the coefficient with input data elements representing another coefficient of the irrational number to produce a combined coefficient;

multiplying the coefficient and the number to produce an intermediate result;

summing the intermediate result and the addend to provide a result having minimal truncation and rounding error; and producing an output signal in response to the result.

17. The method of claim 16 wherein the number is square root of two ($\sqrt{2}$).

18. The method of claim 17 wherein when the combining step includes multiplying the coefficient with the input data elements, the combining step includes the steps of:

switching contents of the first memory portion and contents of the second memory portion; and shifting the contents of the second memory portion one bit left.

19. A digital signal processor configured to digitally filter an input signal representing an irrational value, the digital signal processor comprising:

an input of the processor configured to receive input data related to the input signal, the input data including data corresponding to an input coefficient to be multiplied by square root of two ($\sqrt{2}$) and an input addend;

a first memory for storing a coefficient of the square root of two;

a second memory for storing an addend;

a summer which independently sums the input coefficient and the coefficient to produce a combined coefficient and sums the input addend and the addend to produce an addend sum;

a multiplier which multiplies the combined coefficient and an approximation of the square root of two to produce an intermediate result;

a summer which sums the intermediate result and the addend sum to produce output data having minimal error due to truncation and rounding; and an output configured to provide an output signal corresponding to the output data.

20. The digital signal processor of claim 19 further comprising a third memory for storing the approximation of the square root of two ($\sqrt{2}$).

* * * * *